United States Patent [19]
Adair et al.

[11] Patent Number: 6,165,651
[45] Date of Patent: Dec. 26, 2000

[54] APPARATUS FOR TUNING AN ATTENUATING PHASE SHIFT MASK

[75] Inventors: William John Adair; David Shawn O'Grady, both of Jericho; Song Peng, South Burlington, all of Vt.

[73] Assignee: International Business Machines Corporation, Armonk, N.Y.

[21] Appl. No.: 09/393,469

[22] Filed: Sep. 10, 1999

Related U.S. Application Data

[60] Division of application No. 09/225,128, Jan. 4, 1999, Pat. No. 6,027,837, which is a continuation-in-part of application No. 08/949,916, Oct. 14, 1997, abandoned.

[51] Int. Cl.$^7$ ...................................................... G03F 9/00
[52] U.S. Cl. ................................................. 430/5; 156/345
[58] Field of Search ................................ 430/5, 322, 323; 216/12; 156/345

[56] References Cited

U.S. PATENT DOCUMENTS

| | | | |
|---|---|---|---|
| 4,454,001 | 6/1984 | Sternheim et al. | 156/626 |
| 4,548,883 | 10/1985 | Wagner | 430/5 |
| 5,085,957 | 2/1992 | Hosono | 430/5 |
| 5,371,582 | 12/1994 | Toba et al. | 356/73 |
| 5,405,721 | 4/1995 | Pierrat | 430/5 |
| 5,527,647 | 6/1996 | Doi et al. | 430/5 |
| 5,549,995 | 8/1996 | Tanka et al. | 430/5 |
| 5,569,392 | 10/1996 | Miyoshi et al. | 216/60 |
| 5,700,605 | 12/1997 | Ito et al. | 430/5 |

OTHER PUBLICATIONS

Ohtsuka, et al., "Conjugate Twin–Shifter for the New Phase Shift Method to High Resolution Lithography," SPIE, vol. 1463, pp. 112–123 (1991).

Yoshioka et al. "Practical Attenuated Phase–Shifting Mask with a Single–Layer Absorptive of MoSiO and MoSiON for ULSI Fabrication," IEEE, IEDM, pp. 653–656 (1993).

*Primary Examiner*—S. Rosasco
*Attorney, Agent, or Firm*—Scully, Scott, Murphy & Presser; Howard J. Walter, Jr.

[57] ABSTRACT

The present invention provides a method and an apparatus for tuning the phase shifting of a phase shift mask having an attenuating phase shifting material providing at least 160° of phase shift. The method comprising the utilization of a phase measurement and selective etching operations which reduces the challenge of making an exacting 180° phase shifting mask. An attenuated phase shift mask structure is also disclosed in the present invention.

9 Claims, 3 Drawing Sheets

APPARATUS FOR TUNING AN ATTENUATING PHASE SHIFT MASK

RELATED APPLICATIONS

This application Ser. No. 09/225,128, filed Jan. 4, 1999, U.S. Pat No. 6,027,837, which is a continuation-in-part application of U.S. application Ser. No. 08/949,916, filed Oct. 14, 1997 abandoned.

TECHNICAL FIELD

The present invention relates to optical lithography and, in particular, to a method and an apparatus for tuning the phase shifting of a phase shift mask having an attenuating phase shifting material providing at least 160° of phase shifting. Specifically, the method of the present invention is capable of directly tuning a phase shifting material by the controlled removal of: (i) portions of a transparent or semi-transparent substrate on which said phase shifting material is applied to; (ii) portions of the phase shifting material; or (iii) portions of both the transparent or semi-transparent substrate and the phase shifting material. The controlled removal allows for tuning a phase shift mask to about 180° directly during the mask's fabrication. The present invention also relates to an attenuating phase shift mask structure which has a phase measurement of between about 170° to about 190°.

PRIOR ART

Phase shifting technology is one of the useful methods available to enhance the performance of optical lithography. An attenuating phase shifting mask normally consists of an absorbing phase shifting material having from about 5 to about 20% transmittance and a transparent or semi-transparent substrate. The absorptive shift patterns have been formed with a two layered structure comprising a $SiO_2$ film to control the phase and a thin Cr film to control the transmittance.

A single layer shifter comprising an oxide or an oxynitride film of MoSi, described by Yoshioka, et al. "Practical attenuated phase-shifting mask with a single-layer absorptive shifter of MoSiO and MoSiON for ULSI fabrication", IEEE, IEDM 93 pp. 653–656, is also known. This attenuating phase shift mask is fabricated by steps comprising: sequentially applying a MoSiO shifter, a Mo film and a resist to a glass substrate; developing the resist; etching the exposed regions of the glass substrate by reactive ion etching (RIE) in a gas mixture of $CF_4$ and $O_2$; removing the resist by utilizing an $O_2$ plasma; and wet etching the Mo film layer. The single layer attenuating phase shift mask produced by the method described in Yoshioka, et al. has a 180° phase shift and a transparency of between about 5 and 20%. The desired phase shifting is achieved in the disclosure of Yoshioka, et al. by their selection of a substrate material that has a phase shift of about 180°. Deviations from this 180° phase shift can occur during the fabrication process disclosed in Yoshioka, et al.

As is well known to those skilled in the art, an attenuating phase shift mask can produce a high resolution image on a wafer when the attenuating phase shift mask is fabricated to a tight 180° (relative to the mask usage wavelength) tolerance. Variations in the starting phase shift film and the means in which the same is fabricated may cause the mask to have an error from the desired 180° phase shift.

As is disclosed in Yoshioka, et al., the prior art requires multiple processing steps in forming their attenuating phase shift masks. These multiple processing steps may introduce a significant phase shift from the desired 180°. That is, the prior art processes do not account for mean phase errors which arise during the fabrication of the attenuating phase shift mask. There is thus a need to develop a new and improved method of fabricating an attenuating phase shift mask that compensates for the mean phase error in the phase shifting material. Specifically, there is a need for developing a method for tuning the mask to 180° during the fabrication process which eliminates all of the drawbacks mentioned hereinabove with prior art processes.

SUMMARY OF THE INVENTION

One object of the present invention is to provide a method for tuning an attenuating phase shift mask to an exact phase.

Another object of the present invention is to provide a method which compensates for phase errors in the attenuating phase shifting material that may occur during the fabrication of the attenuating phase mask.

A further object of the present invention is to provide a method of fabricating an attenuating phase mask that is tuned to about180° with a high degree of accuracy.

Yet a further object of the present invention is to provide an apparatus for fabricating a phase shift mask that is tunable to about 180°.

In one embodiment of the present invention, the above as well as other objects are achieved by utilizing a method which includes the controlled removal of portions of the transparent or semi-transparent substrate on which the phase shifting material is applied so as to provide 20° or less of phase shift in the substrate. Specifically, in this aspect, the present invention relates to a method for tuning the phase shifting of a phase shift mask having an attenuating phase shifting material providing at least 160° of phase shifting, said method comprises the steps of:

(a) forming line segment images in a phase shifting material, said phase shifting material being located on an area of a transparent or semi-transparent substrate;

(b) measuring the actual phase shift provided by the imaged phase shifting material; and (c) etching the substrate in areas not covered by said imaged phase shifting material by an amount sufficient to provide about180° of phase shift.

In accordance with the above embodiment of present invention, step (a) is carried out by spinning a photoresist on a layer of a phase shifting material which has been previously applied to a transparent or semi-transparent substrate; writing lines, i.e., patterning, on predetermined areas of the photoresist; developing the photoresist; and etching the developed photoresist and areas of the phase shifting material not containing the desired pattern. In step (b) of the present invention, a laser beam and a phase interferometer are utilized to determine the actual phase shift caused by the phase shifting material. Step (c) of the present invention includes a wet etch, a dry etch or combination of the two and it selectively removes 20° or less of phase shift from the transparent or semi-transparent substrate so as to tune the imaged phase shifting material to about 180°.

In another embodiment of the present invention, the phase shift of a phase shift mask having an attenuating phase shifting material providing at least 160° of phase shifting is tuned by a method which comprises conducting steps (a)–(b) above and then (c') etching a portion of the imaged phase shifting material by an amount sufficient to provide about 180° of phase shift to the phase shifting material. This embodiment of the present invention is employed when the attenuating phase shifting material has a measured phase that is above a desired predetermined value.

In yet another embodiment of the present invention, a combination of controlled etching of the substrate and the phase shifting material may be used to tune the phase shifting material. In accordance with this aspect of the present invention, the method comprises the steps of:

(a) forming line segment images in a phase shifting material, said phase shifting material being located on an area of a transparent or semi-transparent substrate;

(b) measuring the actual phase shift provided by the imaged phase shifting material;

(c) etching the substrate in areas not covered by said imaged phase shifting material by an amount sufficient to provide about 180° of phase shift, or (c') etching a portion of the imaged phase shifting material by an amount sufficient to provide about 180° of phase shift; and (d) repeating steps (b) and (c) or (c') any number of times until a 180° phase shift is obtained.

Another aspect of the present invention relates to an apparatus for tuning the phase shifting of a phase shift mask having an attenuating phase shifting material providing at least 160° of phase shifting. Specifically, the apparatus of the present invention comprises:

(a) means for measuring the actual phase shift provided by a line imaged mask, said line imaged mask comprising a phase shifting material providing at least 160° of phase shifting located on a transparent or semi-transparent substrate;

(b) means for etching said transparent or semi-transparent substrate to a depth to provide about 20° or less of phase shift in said substrate; and (c) means for providing a feedback when said etching is completed.

In alternative embodiments, means (b) may be replaced by means (b') which includes a means for etching the phase shifting material to a depth to provide about 0.01° to about 20° of phase shift in said phase shifting material, or means (b) and (b') may be used in conjunction with each other.

Another aspect of the present invention relates to an attenuating phase mask structure comprising a transparent or semi-transparent substrate having an attenuating phase shift material on a portion of said substrate, wherein said substrate, said phase shift material or both contains areas etched to provide about 0.01° to about 20° phase shift in said substrate or in said phase shift material.

DETAILED DESCRIPTION OF THE INVENTION

Figure 1A:
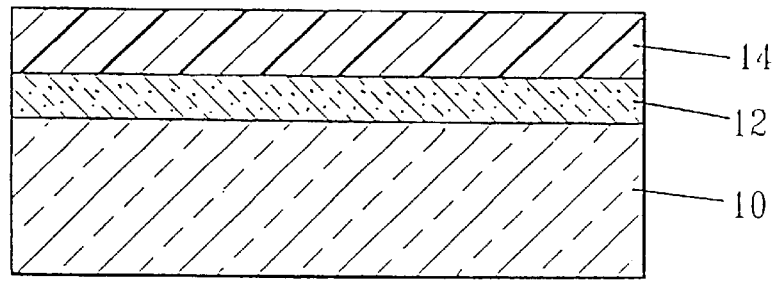
FIGS. 1(a)–(d) are cross-sectional views of an attenuating phase shift mask prepared in accordance with one embodiment of the present invention: (a) mask structure prior to conducting step (a) of the present invention; (b) mask structure after conducting step (a); (c) mask structure after wet etching; and (d) mask structure after dry etching.

The present invention which provides a method and an apparatus for tuning the phase shifting of a phase shift mask as well as a phase mask structure will now be described in greater detail with reference to the accompanying drawings wherein like reference numerals are used for like and corresponding elements of the drawings.

As stated above, one aspect of the present invention relates to a method for tunning the phase shifting of a phase shift mask having an attenuating phase shifting material providing at least 160° of phase shifting therein. In accordance with step (a) of the present invention, line segment images are formed in a phase shifting material which is positioned on a transparent or semi-transparent substrate. Specifically, as shown in FIG. 1(a), the line segment image is formed as follows:

First a phase shifting material 12 is applied to one surface of transparent or semi-transparent substrate 10 utilizing conventional techniques well known to those skilled in the art. For instance, the phase shifting material may be deposited onto the substrate by utilizing conventional chemical vapor deposition (CVD) or direct current (DC) sputtering.

Suitable materials which may comprise transparent or semi-transparent substrate 10 include, but are not limited to: quartz, glass, calcium fluoride, diamond, diamond-like carbon and the like. A highly preferred material employed in the present invention as substrate 10 is quartz.

Transparent or semi-transparent substrate 10 employed in the present invention may be used as is, or it can be cleaned prior to use utilizing techniques well known to those skilled in the art that are effective for removing any contaminants from the substrate.

It is noted that in the prior art, it is critical that the substrate material of the phase shift mask have a phase shift as close to 180° as possible. This is so, since any significant deviations from 180° would result in a significant phase error that could not be compensated for during the manufacturing of the attenuating phase mask. In the present invention, it is not critical to use a substrate material which initially has a phase shift of 180°. Typically, the substrate materials employed in the present invention have an initial phase shift of from about 170° to about 178°.

Any attenuating phase shifting material well known to those skilled in the art that is semi-transparent and has at least a 160° of phase shift can be used as layer 12. Examples of phase shifting material which satisfy the above criteria and thus can be used in the present invention include, but are not limited to: MoSi, carbon, chrome oxide, chrome nitride, silicon nitride, chrome fluoride, chrome oxide fluoride and. the like. A highly preferred phase shifting material that is employed in the present invention is MoSi.

After applying the phase shifting material 12 to substrate 10, a photoresist 14 is spun onto layer 12 utilizing conventional techniques well known to those skilled in the art. Any photoresist which is capable of being written on, i.e. patterned, and is sensitive to e-beam or laser light exposure may be employed in the present invention. This includes positive photoresists as well as negative photoresists. Illustrative examples of suitable photoresists that may be employed in the instant invention include, but are not limited to: poly(butene-1-sulphone) (PBS) and 895i, which is a positive novolak resist.

Next, a desired pattern is provided in the photoresist utilizing conventional e-beam or laser write techniques well known to those skilled in the art. For example, one way of writing a desired pattern into photoresist 14 is by e-beam writing a reference data design using a raster-scan. This technique transfers the designed pattern from the data design into photoresist 14.

Figure 1B:
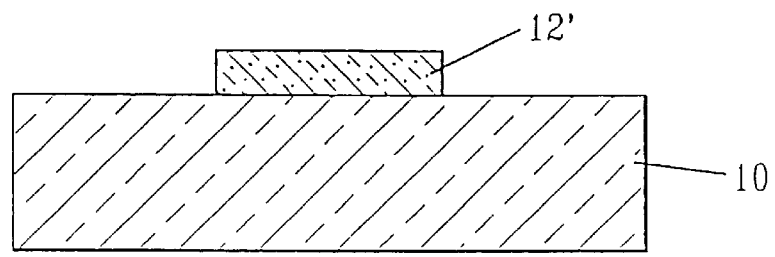

After providing the desired pattern to photoresist 14, the pattern is developed utilizing conventional methods which include, but are not limited to: Using sodium hydroxide, tetramethylammonium hydroxide (TMAH), methylisobutylketone (MIAK) with isopropyl alcohol or mixtures thereof. This creates a resist structure which contains a pattern thereon. Next, the mask is etched utilizing standard etching techniques well known to those skilled in the art to provide the structure shown in FIG. 1(b) which comprises substrate 10 having an imaged phase shifting material, i.e. the mask, 12' thereon. It is noted that this etching step of the present invention is carried out using a dry plasma etch that is highly selective for the phase shifting material. Almost no etching of substrate 10 occurs in this step of the present invention. Suitable dry plasma etchants that are highly selective for the phase shifting material include, but are not limited to: $CF_4$, $CHF_3$, $O_2$, $SF_6$ and combinations thereof.

Figure 2:
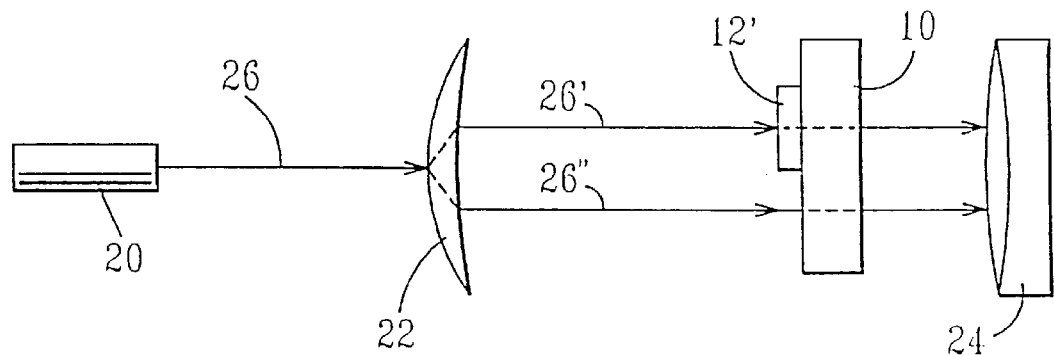
FIG. 2 illustrates means for determining the transmittance difference between the imaged mask and the transparent or semi-transparent substrate.

In accordance with step (b) of the present invention, the actual phase shift provided by imaged phase shifting material 12' is then measured by utilizing the means shown in FIG. 2. Specifically, in FIG. 2, there is shown a laser source 20, a beam splitter 22, the structure of FIG. 1(b) and a phase interferometer 24. The measurement is made by first splitting laser beam 26 from laser source 20 into two beams, 26' and 26", respectively, by passing beam 26 through beam splitter 22. One of the split beams, e.g., 26", is focused on a portion of substrate 10 and the other, e.g., 26', is focused on imaged phase shifting material 12'. The two beams exiting the structure are then passed through phase interferometer 24 wherein the difference between the two beams, which is representative of the phase shift of the imaged phase shifting material, is determined.

Using the means shown in FIG. 2, the actual phase shift of the imaged phase shifting material can be determined and used to tune the imaged mask to about 180° with high accuracy by utilizing, in this embodiment, a controlled etching regime to remove portions of substrate 10 not containing imaged phase shifting material 12'. The controlled etching is performed by utilizing a dry etch, a wet etch or a combination thereof. It is emphasized that the controlled etching step of the present invention, step (c), is highly selective for etching transparent or semi-transparent substrate 10. In accordance with the present invention, the conditions employed in this step of the present invention are sufficient to remove enough substrate so as to provide a phase shift of from about 0.01° to about 20° in said substrate. The amount of material to be removed is determined by the deviation of imaged phase shifting material 12' from 180°. For example, if the imaged mask has a phase shift of 175°, the mask can be tuned by selectively removing portions of substrate 10 so as to provide a 5° phase shift in the substrate. A 180° tuned mask is, thus, formed.

Suitable dry etching techniques that can be employed in the present invention to selectively remove portions of substrate 10 include: reactive ion etching (RIE), chemical dry etching, ion beam etching, plasma etching and the like. The gases which may be employed in these dry etching techniques are those that have a high affinity for the transparent or semi-transparent substrate. Examples of suitable gases that can be employed in the present invention are $CF_4$, $SF_6$, $NF_3$, $CHF_3$ and combinations thereof. The gases may also be used in conjunction with oxygen or other chemicals such as Ar, $N_2$ and He.

When a wet etch is employed to selectively etch transparent or semi-transparent substrate 10 containing imaged phase shifting material 12', the chemical etchants employed include: HF, NaOH, buffered HF and the like. Mixtures of these chemical etchants alone or with water are also contemplated herein. The chemical etchants may also be buffered to a desired pH using well known buffering agents. A highly preferred chemical etchant employed in the present invention is buffered HF.

Figure 1C:
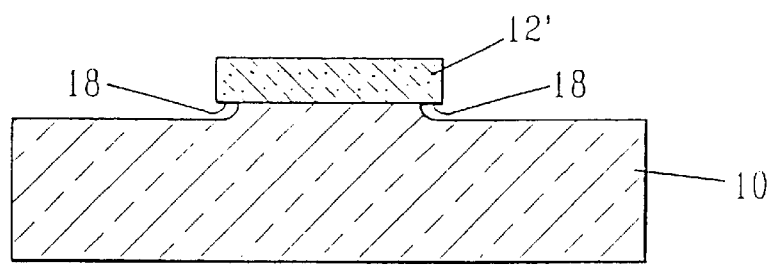
Figure 1D:
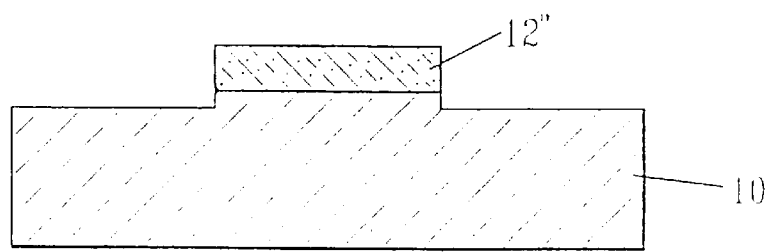

It is noted that the above described selective etching step of the present invention is conducted to provide a mask having a phase shift of about 180°. Typically, this controlled etching step removes from about 10 to about 300 angstroms of the substrate material. The final structure formed from the present invention is shown in FIGS. 1(c) and (d). Specifically, FIG. 1(c) shows an attenuating phase mask of the present invention wherein the substrate is etched by utilizing a chemical etchant. It is noted that undercuts 18 are present in this structure since a chemical etchant is used in step (c) In FIG. 1(d), the attenuating mask was tuned by etching the substrate with a dry etch process—no undercut is present.

Figure 4A:
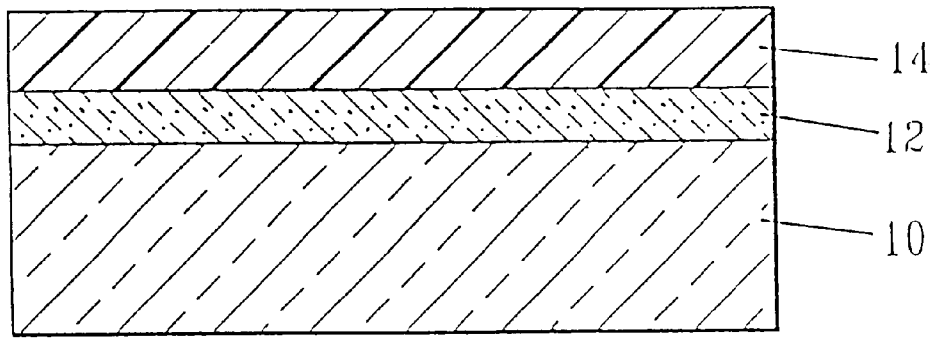
FIGS. 4(a)–(c) are cross-sectional views of an attenuating phase shift mask prepared in accordance with an alternative embodiment of the present invention: (a) mask structure prior to conducting step (a) of the present invention; (b) mask structure after conducting step (a); and (c) mask structure after dry etching.
Figure 4B:
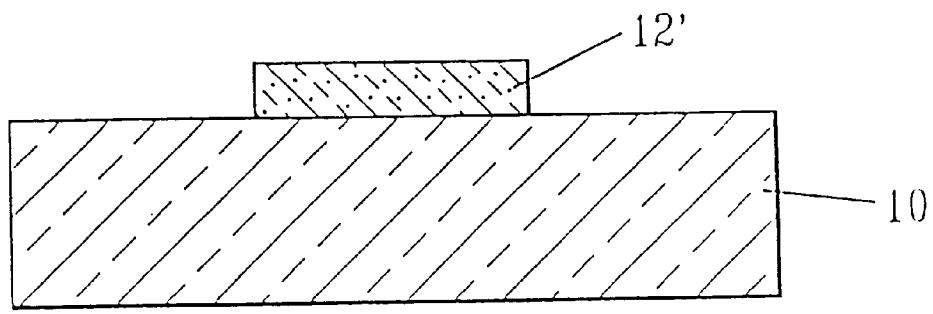
Figure 4C:
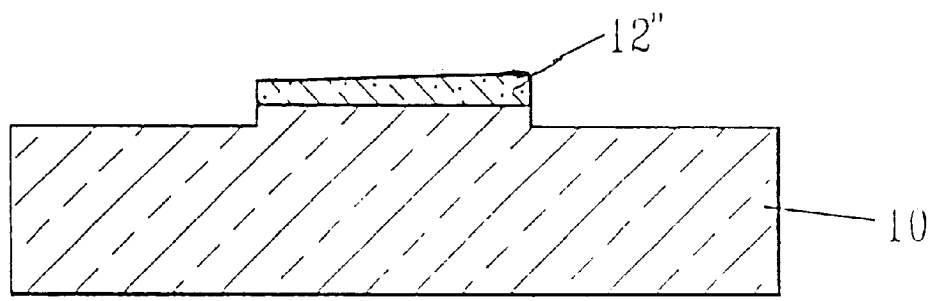

Reference is now made to FIGS. 4(a)–(c) which shown an alternative embodiment of the method of the present invention. In the alternative embodiment, the phase shift of image phase shifting material 12' is tuned by selectively removing, i.e. etching, the phase shift material itself. This embodiment of the present invention is employed when the measured phase shift of imaged phase shift mask 12' is greater than a selected target value. It is noted that in this embodiment of the present invention steps (a) and (b) mentioned hereinabove in regard to FIG. 1 are first performed and then the phase shifting material is selectively etched instead of the substrate.

The imaged phase shifting material is selectively etched in the present invention by utilizing an etch process which is highly selective for the phase shifting material. Dry etching, chemical etching or a combination thereof may be employed to selectively etch the phase shifting material. In FIG. 4(c), dry etching was used to remove portions of imaged phase shifting material 12'. In a typical process, from about 10 to about 100 Angstroms of imaged phase shifting material is removed.

Suitable dry etching processes that can be employed in etching the imaged phase shifting material include those mentioned hereinabove. The selective etch is accomplished by changing the pressure of the etching technique. While low pressures of from about 5 to about 50 mTorr are employed in selectively dry etching the substrate, higher pressures of from about 50 to about 300 mTorr are employed in selectively dry etching the imaged phase shifting material.

In accordance with one aspect of the present invention, the selective dry etch removes from about 10 to about 300 Å of said transparent or semi-transparent substrate. In another aspect, the selective dry etching removes from about 10 to about 100 Å of said imaged phase shifting material.

When a wet etch is employed to etch imaged phase shifting material 12', the chemical etchants employed include: HF and $HNO_3$. Mixtures of these chemical etchants alone or with water are also contemplated herein. The chemical etchants may also be buffered to a desired pH using well known buffering agents. A highly preferred chemical etchant employed in the present invention to etch the imaged phase shifting material is a mixture of HF and $HNO_3$.

In addition to employing each of the above selective etch processes separately, it is also contemplated by the present invention to employ both together. In accordance with this embodiment of the present invention, steps (a)–(b) are first carried out then either the substrate or the phase shifting material is selectively etched. The phase shift of the mask is then measured again using step (b) and then, if necessary, etching of the substrate or the phase shifting material may be carried out. It is emphasized that the substrate is etched if the measured phase shift is below a predetermined value, whereas the imaged phase shifting material is etched if the phase shift is above a predetermined value.

In accordance with the second aspect of the present invention, an apparatus for tuning the phase shifting of a phase mask is provided. Specifically, the apparatus of the present invention comprises:

(a) means for measuring the actual phase shift provided by a line imaged mask, said line imaged mask comprising a phase shifting material providing at least 160° of phase shifting located on a transparent or semi-transparent substrate;

(b) means for etching either said transparent or semi-transparent substrate, said phase shifting material or both to a depth to provide a phase shift of about 20° or less;

(c) means for providing a feedback when said etching is completed; and (d) optionally, means for stopping the etching.

Figure 3:
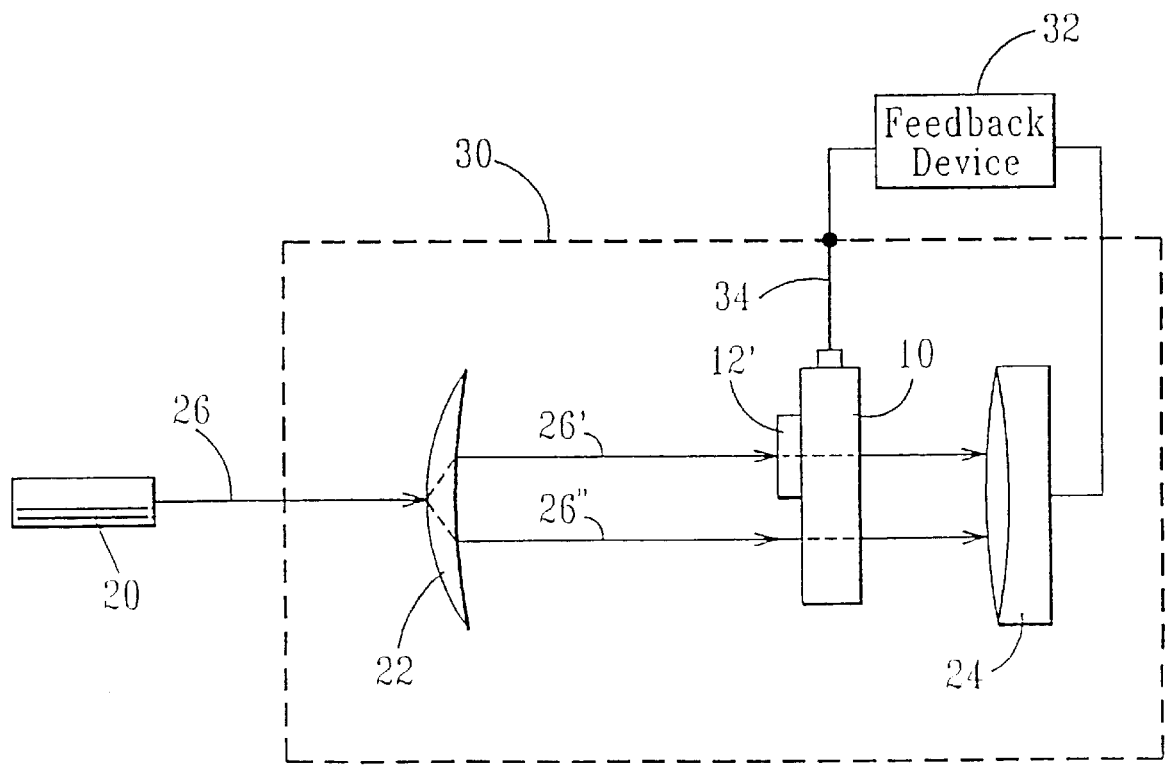
FIG. 3 illustrates one embodiment of the apparatus of the present invention.

Reference is made to FIGS. 2 and 3, which illustrate the apparatus of the present invention. Specifically, FIG. 2 which was discussed in greater detail hereinabove represents the measurement means of the apparatus of the present invention. The measurement means shown in FIG. 2 is employed in FIG. 3, which illustrates all of the means of the apparatus of the present invention. In addition to including laser source 20, beam splitter 22, phase interferometer 24 and imaged phase shift material 12' and substrate 10, the apparatus of the present invention also includes a housing means 30 wherein either the dry or wet etch of substrate 10 occurs, a feedback device 32 such as a computer or alarm which indicates when the phase of the structure is within180°, and a robot arm 34 for removing the tuned mask from the etchant medium. When a wet etchant is employed the housing means includes a suitable chemical etchant that is highly selective for the transparent or semi-transparent substrate. On the other hand, when a dry etch is performed the housing means includes a source region for bombarding the imaged mask with a suitable etchant gas.

The above description illustrates the method and apparatus of the present invention, as well as various phase shift mask structures that can be formed from the same. It is noted that the method of the present invention provides a means for directly tuning an attenuating phase shift mask to about 180° with a high degree of accuracy.

While the invention has been particularly shown and described with respect to the preferred embodiments thereof, it will be understood by those skilled in the art that the foregoing and other changes in form and details made by made without departing from the scope and spirit of the present invention. It is therefore intended that the invention be not limited to the exact forms described and illustrated, but should be constructed to cover all modifications that may fall within the scope of the appended claims. For example, this principle applies to masks utilizing technology with wavelength below light, such as X-rays.

Having thus described our invention, what we claim as new, and desire to secure by the Letters Patent is:

1. An apparatus for tuning the phase shifting of an attenuating phase shift mask having a phase shifting material providing at least 160° of phase shifting, said apparatus comprising:

(a) means for measuring the actual phase shift provided by a line imaged mask, said line imaged mask comprising a phase shifting material providing at least 160° of phase shifting located on a transparent or semi-transparent substrate, said measuring means including a laser source, a beam splitter position in front of said laser source and a phase interferometer position behind said beam splitter, said line imaged mask being positioned between said beam splitter and said phase interferometer whereby a laser beam from said laser source is split into a first beam and a second beam by said beam splitter, said first beam is focused on a portion of said substrate and said second beam is focused on said phase shifting material, said first and second beams exiting said substrate and said phase shifting material being passed through said phase interferometer wherein any difference between the first and second beams, which is representative of the phase shift of said phase shifting material, is determined;

(b) means for selectively etching said transparent or semi-transparent substrate to a sufficient depth so as to tune said phase shifting of said mask to about 180°; and (c) means for providing a feedback when said tuning has been completed.

2. The apparatus of claim 1 wherein means (b) is replaced with (b'): means for selectively etching the imaged phase shifting material to a sufficient depth so as to tune said phase shifting of said mask to about 180°.

3. The apparatus of claim 1 further comprising (b') means for selectively etching the imaged phase shift material to a sufficient depth so as to tune said phase shifting of said mask to about 180°.

4. The apparatus of claim 1 wherein said selective etching means includes a dry etch or a wet etch housing means.

5. The apparatus of claim 4 wherein said dry etch housing means includes a source for bombarding the imaged mask with a gaseous etchant.

6. The apparatus of claim 4 wherein said wet etch housing means includes a chemical etchant.

7. The apparatus of claim 1 wherein said feedback means includes a computer or an alarm device.

8. The apparatus of claim 1 further comprising (d) a means for stopping said etching.

9. The apparatus of claim 8 wherein said means for stopping said etching includes a robot arm.

* * * * *